United States Patent
Lim et al.

(10) Patent No.: US 9,867,314 B2
(45) Date of Patent: Jan. 9, 2018

(54) METHOD FOR CONTROLLING TEMPERATURE OF INVERTER SYSTEM BY CONTROLLING A FAN

(71) Applicant: LSIS CO., LTD., Anyang-si, Gyeonggi-do (KR)

(72) Inventors: Deokyoung Lim, Cheonan-si (KR); Chun Suk Yang, Seongnam-si (KR)

(73) Assignee: LSIS CO., LTD., Anyang-si (KR)

( * ) Notice: Subject to any disclaimer, the term of this patent is extended or adjusted under 35 U.S.C. 154(b) by 334 days.

(21) Appl. No.: 14/738,729

(22) Filed: Jun. 12, 2015

(65) Prior Publication Data

US 2015/0366104 A1    Dec. 17, 2015

(30) Foreign Application Priority Data

Jun. 16, 2014  (KR) .................. 10-2014-0072594

(51) Int. Cl.
*H05K 7/20*     (2006.01)
*G05B 15/02*    (2006.01)

(52) U.S. Cl.
CPC ......... *H05K 7/20209* (2013.01); *G05B 15/02* (2013.01); *H05K 7/20909* (2013.01); *H05K 7/20945* (2013.01)

(58) Field of Classification Search
CPC .......... H05K 7/20209; H05K 7/20127; H05K 7/2089; H05K 7/20909; H05K 7/20945
See application file for complete search history.

(56) References Cited

U.S. PATENT DOCUMENTS

| 5,831,847 A | 11/1998 | Love |
| 6,236,184 B1 | 5/2001 | Baker |
| 7,205,740 B1 * | 4/2007 | Wei ............... F04D 25/166 318/434 |
| 2007/0147100 A1 | 6/2007 | Tashima et al. |

FOREIGN PATENT DOCUMENTS

| CN | 1992498 | 7/2007 |
| JP | 05-004582 | 1/1993 |
| JP | 10-143257 | 5/1998 |
| JP | 2002-325463 | 11/2002 |
| JP | 2011-83135 | 4/2011 |
| JP | 2013-46481 | 3/2013 |
| JP | 2013-143830 | 7/2013 |

(Continued)

OTHER PUBLICATIONS

Korean Intellectual Property Office Application Serial No. 10-2014-0072594, Office Action dated Aug. 15, 2015, 4 pages.

(Continued)

*Primary Examiner* — Jonathan Bradford
(74) *Attorney, Agent, or Firm* — Lee, Hong, Degerman, Kang & Waimey (57) ABSTRACT

A method for controlling temperature of an inverter system having an inverter and a cooling fan is provided, the method including: obtaining an internal temperature of the inverter and a DC (Direct Current)-link voltage of the inverter; and outputting a fan driving control signal for driving the fan or maintaining the fan being driven to the fan, when the internal temperature is above a predetermined fan drive setting temperature and the DC-link voltage is above a predetermined fan drive setting voltage.

11 Claims, 7 Drawing Sheets

(56) References Cited

FOREIGN PATENT DOCUMENTS

KR  10-2014-0003979     1/2014
WO     2010-032300      3/2010
WO  WO 2013103711 A2 *  7/2013  ......... H05K 7/20945

OTHER PUBLICATIONS

European Patent Office Application Serial No. 15171432.6, Search Report dated Nov. 3, 2015, 7 pages.
Korean Intellectual Property Office Application Serial No. 10-2016-0056145, Office Action dated Oct. 26, 2016, 5 pages.
State Intellectual Property Office of the People's Republic of China Application Serial No. 201510446926.8, Office Action dated Dec. 5, 2016, 5 pages.
Japan Patent Office Application Serial No. 2015-121170, Office Action dated May 31, 2016, 2 pages.

* cited by examiner

METHOD FOR CONTROLLING TEMPERATURE OF INVERTER SYSTEM BY CONTROLLING A FAN

CROSS-REFERENCE TO RELATED APPLICATIONS

Pursuant to 35 U.S.C. §119(a), this application claims the benefit of earlier filing date and right of priority to Korean Patent Application No. 10-2014-0072594, filed on Jun. 16, 2014, the contents of which are hereby incorporated by reference herein in its entirety.

BACKGROUND

Field of the Disclosure

The present disclosure relates to a temperature control method of an inverter system by controlling a fan. More specifically, the present disclosure relates to a temperature control method of an inverter system by controlling a fan to suppress temperature increase in a SMPS (Switched-Mode Power Supply) and peripherals by controlling a fan when the inverter is stopped after inputting electrical power to the inverter.

Discussion of the Related Art

An inverter is a device to control torque and speed of a motor. There have been introduced various motor speed controlling methods, some of which representative methods are the first voltage control method and the frequency control method. The inverter may be used for, such as efficiency control, power factor control, etc. In addition, the inverter may also be used by being applied to, such as a preliminary power supply, an uninterruptible power supply for a computer, direct current transmission, etc.

Purposes of using the inverter are for process control, factory automation, and energy conservation. For example, in the case of a heating furnace blower, an inverter may control speed of the blower according to types or quantity of products. Temperature inside the heating furnace may be controlled as the optimal temperature by controlling air volume of the blower, and the quality of the product can be improved as well. Thereby, a great retrenchment in energy consumption can be obtained. Currently, researches for technology to efficiently control an inverter when an urgent situation such as instantaneous blackout occurs are conducted actively.

An inverter includes an SMPS (Switched-Mode Power Supply) inside thereof. The SMPS is a power supply including a switching regulator to efficiently convert electric power. The SMPS becomes a heat source to increase temperature of internal components of the inverter, when the inverter is not driven while being inputted with electric power.

Temperature of the SMPS increases as DC (Direct Current)-link voltage and switching frequency grows larger. Load of the SMPS increases and internal convection of the inverter occurs to suppress temperature increase in peripherals due to the SMPS, when the inverter and the fan start to be driven.

A heat sink at a lower part of the inverter can prevent a three-leg switch at an output part of the inverter from an excessive temperature increase. However, the heat sink may not suppress temperature increase of the SMPS. Temperature of the SMPS and the peripherals comes to increase due to load reduction of the SMPS and deterioration in internal convection of the inverter, when the inverter and the fan are stopped.

Conventional conditions for driving the fan are divided, such as when the inverter is being driven, when temperature of a switch module at an output part is above a predetermined value, or constant drive.

In the case of small capacity inverters in which internal space is confined and has a poor condition for convection, temperature of the peripherals comes to increase due to the SMPS when the inverter is stopped. However, there is no method to suppress the peripheral temperature increase but to constantly drive the fan.

The temperature increase of SMPS may be lessened by inserting a dummy load, when using a method to change a switching frequency according to the load of SMPS. However, the method is suitable for a product in which internal space is confined because additional components are required. Furthermore, effect of such method is not significant.

Meanwhile, the temperature increase of peripherals may be suppressed by constantly driving the fan when the inverter is stopped. However, there is a disadvantage in that a certain amount of electric power should be constantly consumed.

SUMMARY OF THE DISCLOSURE

A technical challenge that the present disclosure intends to achieve is, to provide a temperature control method of an inverter system by using a fan control to suppress temperature increase in a SMPS and peripherals by improving the environment for convection in the inverter through the fan control.

Technical challenges of the present disclosure are not limited to the above-mentioned technical challenges. Other technical challenges which are not mentioned will be clearly understandable for persons who skilled in the technical field to which exemplary embodiments suggested from the following description belong.

In a general aspect of the present disclosure, there is provided a method for controlling temperature of an inverter system having an inverter and a cooling fan, the method comprising: obtaining an internal temperature of the inverter and a DC (Direct Current)-link voltage of the inverter; and outputting a fan driving control signal for driving the fan or maintaining the fan being driven to the fan, when the internal temperature is above a predetermined fan drive setting temperature and the DC-link voltage is above a predetermined fan drive setting voltage.

In some exemplary embodiments of the present disclosure, the step of outputting the fan driving control signal to the fan may include: outputting a fan driving control signal for driving the fan to the fan, when the internal temperature is above a predetermined fan drive setting temperature and the DC-link voltage is above a predetermined fan drive setting voltage, in a state where the fan is stopped.

In some exemplary embodiments of the present disclosure, the step of outputting the fan driving control signal to the fan may include: outputting a fan driving control signal for maintaining the fan being driven to the fan, when the internal temperature is above a predetermined fan drive setting temperature and the DC-link voltage is above a predetermined fan drive setting voltage, in a state where the fan is being driven.

In some exemplary embodiments of the present disclosure, the step of outputting the fan driving control signal to the fan may include: determining whether the internal temperature is above the predetermined fan driving setting temperature; determining whether the DC-link voltage is above the predetermined fan driving setting voltage, when the internal temperature is determined to be above the predetermined fan driving setting temperature; and outputting the fan driving control signal for driving the fan or maintaining the fan being driven to the fan, when the DC-link voltage is determined to be above a predetermined fan drive setting voltage.

In some exemplary embodiments of the present disclosure, the step of outputting the fan driving control signal to the fan may include: outputting the fan driving control signal for driving the fan to the fan when the fan is stopped, when the DC-link voltage is determined to be above the predetermined fan drive setting voltage.

In some exemplary embodiment of the present disclosure, the step of outputting the fan driving control signal to the fan may include: outputting the fan driving control signal for maintaining the fan being driven to the fan when the fan is being driven, when the DC-link voltage is determined to be above the predetermined fan drive setting voltage.

In some exemplary embodiment of the present disclosure, the step of outputting the fan driving control signal to the fan may include: determining whether the DC-link voltage is above the predetermined fan driving setting voltage; determining whether the internal temperature is above the predetermined fan driving setting temperature, when the DC-link voltage is determined to be above the predetermined fan driving setting voltage; and outputting the fan driving control signal for driving the fan or maintaining the fan being driven to the fan, when the internal temperature is determined to be above the predetermined fan drive setting temperature.

In some exemplary embodiment of the present disclosure, the step of outputting the fan driving control signal to the fan may include: outputting a fan driving control signal for driving the fan to the fan when the fan is stopped, when the internal temperature is determined to be above a predetermined fan drive setting temperature.

In some exemplary embodiment of the present disclosure, the step of outputting the fan driving control signal to the fan may include: outputting a fan driving control signal for maintain the fan being driven to the fan, when the internal temperature is determined to be above the predetermined fan drive setting temperature, in the state where the fan is being driven.

In some exemplary embodiment of the present disclosure, the method for controlling temperature of an inverter system by using a fan control may further include: outputting a fan stopping control signal for stopping the fan to the fan in response to the fan driving control signal, when the internal temperature is determined to be under a predetermined fan stop setting temperature or the DC-link voltage is determined to be under a predetermined fan stop setting voltage, in the state where the fan is being driven.

In some exemplary embodiment of the present disclosure, the fan stop setting temperature may be predetermined to be under the fan drive setting temperature, and the fan stop setting voltage may be predetermined to be under the fan drive setting temperature.

According to an exemplary embodiment of the present disclosure, temperature increase of the SMPS and the peripherals may be suppressed by improving the environment for convection in the inverter through the fan control. Driving the fan by using an internal temperature and a DC-link voltage as control factors can suppress the temperature increase of peripherals more efficiently than constantly driving the fan.

DETAILED DESCRIPTION

Hereinafter, reference will now be made in detail to the embodiments of the present disclosure, examples of which are illustrated in the accompanying drawings. The present disclosure may, however, be embodied in many different forms and should not be construed as being limited to the embodiments set forth herein; rather, that alternate embodiments included in other retrogressive inventions or falling within the spirit and scope of the present disclosure will fully convey the concept of the invention to those skilled in the art.

Although the terms used in the present disclosure are selected from generally known and used terms, some of the terms mentioned in the description of the present disclosure have been selected by the applicant at his or her discretion, the detailed meanings of which are described in relevant parts of the description herein. Therefore, the present disclosure shall be understood, not simply by the general terms used but by the meaning of each term lying within.

That is, in the following description herein, the term "including" or "comprising" does not exclude the presence of elements or steps other than those listed.

Figure 1:
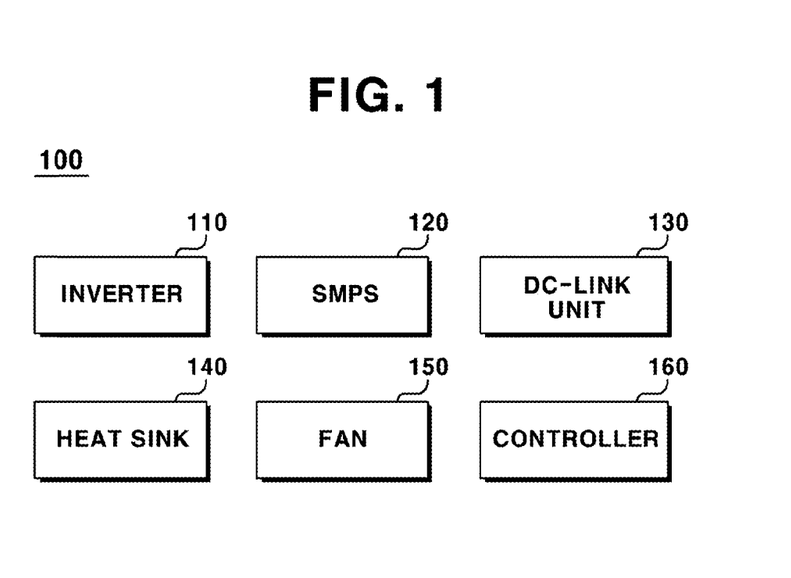
FIG. 1 is a block diagram of an inverter system according to an exemplary embodiment of the present disclosure.

FIG. 1 is a block diagram of an inverter system according to an exemplary embodiment of the present disclosure.

Referring to FIG. 1, an inverter system (100) according to an exemplary embodiment of the present disclosure may include an inverter (110), a SMPS (120), a DC-link unit (130), a heat sink (140), a fan (150), and a controller (160).

The SMPS (Switched-Mode Power Supply) (120) supplies electric power to the inverter (110), and may include a switching regulator to efficiently convert the supplied electric power. The SMPS may become a heat source to increase temperature of internal components of the inverter, when the inverter (110) is not driven while being inputted with electric power. Temperature of the SMPS (120) increases as DC (Direct Current)-link voltage and switching frequency grows larger.

An SMPS of which switching frequency is variable according to load may be used as the SMPS (120). An additional effect of suppressing temperature increase may be expected when using the SMPS of variable switching frequency according to load, since load of the SMPS (120) increases when the fan (150) is driven.

In the case of the SMPS (120) of variable switching frequency according to load, the electric power to drive the fan may become the load of the SMPS (120) to reduce switching frequency and to suppress temperature increase of the SMPS (120).

The DC-link unit (130) converts alternate current electric power rectified by being supplied to the inverter (110) to direct current electric power. The DC-link unit (130) may include a condenser for smoothing the rectified electric power.

The heat sink (140) prevents temperature increase of the inverter (110) or the SMPS (120), by being installed at a lower part of the inverter (110) or the SMPS (120), or by being installed adjacent to the inverter (110) or the SMPS (120).

The fan (150) is installed in order to prevent temperature increase generated by the inverter (110) and the SMPS (120) and to generate a convection flow for cooling. The fan (150) is driven by a fan driving control signal of the controller (160), and stopped by a fan stopping control signal.

The controller (160) outputs a fan driving control signal for driving the fan (150) or maintaining the driven fan (150) being driven to the fan (150) after applying an electric power to the inverter (110), or outputs a fan stopping control signal for stopping the fan (150) being driven or maintaining the stopped fan (150) being still stopped.

The controller (160) may use an internal temperature of the inverter (110) and a DC-link voltage of the DC-link unit (130) as control factors to determine whether the fan (150) is to be driven.

The controller (160) includes a predetermined fan drive setting temperature to drive the stopped fan (150) by being compared to the internal temperature of the inverter (110). The controller (160) may determine that a first condition to drive the fan (150) is satisfied, when the internal temperature of the inverter (110) measured inside the inverter (110) is above the fan driving setting temperature.

The controller (160) includes a predetermined fan drive setting voltage to drive the stopped fan (150) by being compared to the DC-link voltage of the inverter (110). The controller (160) may determine that a first condition to drive the fan (150) is satisfied, when the measured DC-link voltage of the inverter (110) is above the fan driving setting voltage.

The controller (160) may output a fan driving control signal for driving the fan (150) the fan (150), when both of the first and the second conditions are satisfied, that is, when the internal temperature and the DC-link voltage are above the predetermined fan drive setting temperature and the predetermined fan drive setting voltage, respectively.

Convection may occur in the inverter (110) to suppress temperature increase of the SMPS (120) and the peripherals, when the fan (150) is driven by the fan driving control signal outputted from the controller (160).

The controller (160) includes a fan stop setting temperature and a fan stop setting voltage as well as the fan drive setting temperature and the fan drive setting voltage, in order to determine whether the fan (150) is to be driven or stopped.

The controller (160) outputs a fan stopping control signal for stopping the fan (150) to the fan (150), when the internal temperature is determined to be under the predetermined fan stop setting temperature or the DC-link voltage is determined to be under the predetermined fan stop setting voltage.

Here, the fan stop setting temperature may be predetermined to be under the fan drive setting temperature to prevent drive/stop operation of the fan (150) be frequently repeated.

The fan (150) is driven when the internal temperature is above the predetermined fan drive setting temperature and the DC-link voltage is above the predetermined fan drive setting voltage. The temperature increase of the peripherals may be effectively suppressed due to the improved internal convection environment of the inverter (110) through the drive of the fan (150).

Figure 2:
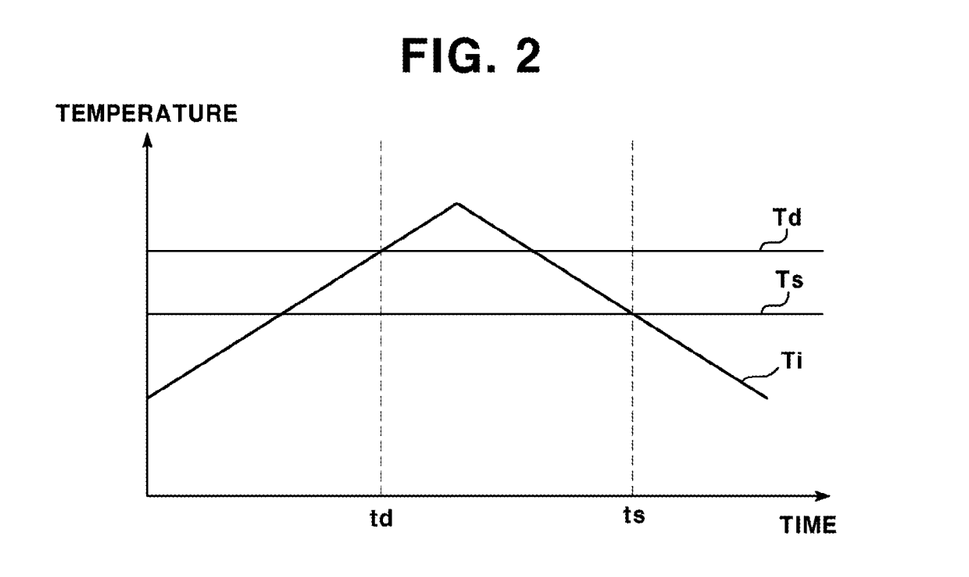
FIG. 2 is a view illustrating a fan drive setting temperature and a fan stop setting temperature in an inverter system according to an exemplary embodiment of the present disclosure.

FIG. 2 is a view illustrating a fan drive setting temperature and a fan stop setting temperature in an inverter system according to an exemplary embodiment of the present disclosure.

Referring to FIG. 2, the fan stop setting temperature (Ts) is predetermined to be under the fan drive setting temperature (Td).

The controller (160) outputs a fan driving control signal for driving the stopped fan (150) to the fan (150), when the DC-link voltage is determined to be above the fan drive setting voltage, by determining whether the DC-link voltage is above the fan driving setting voltage, when a first point of time (td) where the internal temperature (Ti) becomes above the fan drive setting temperature (Td) arrives while the fan (150) is stopped.

Meanwhile, the controller (160) outputs a fan stopping control signal for stopping the fan (150) being driven to the fan (150), when a second point of time (ts) where the internal temperature (Ti) becomes under the fan stop setting temperature (Ts) arrives while the fan (150) is being driven after the first point of time (td) has passed. Of course, the controller (160) may output a fan stopping control signal for stopping the fan (150) being driven to the fan (150), when the DC-link voltage becomes under the fan stop setting voltage, even though the second point of time (ts) where the internal temperature (Ti) becomes under the fan stop setting temperature (Ts) does not arrive while the fan (150) is being driven after the first point of time (td) has passed.

Figure 3:
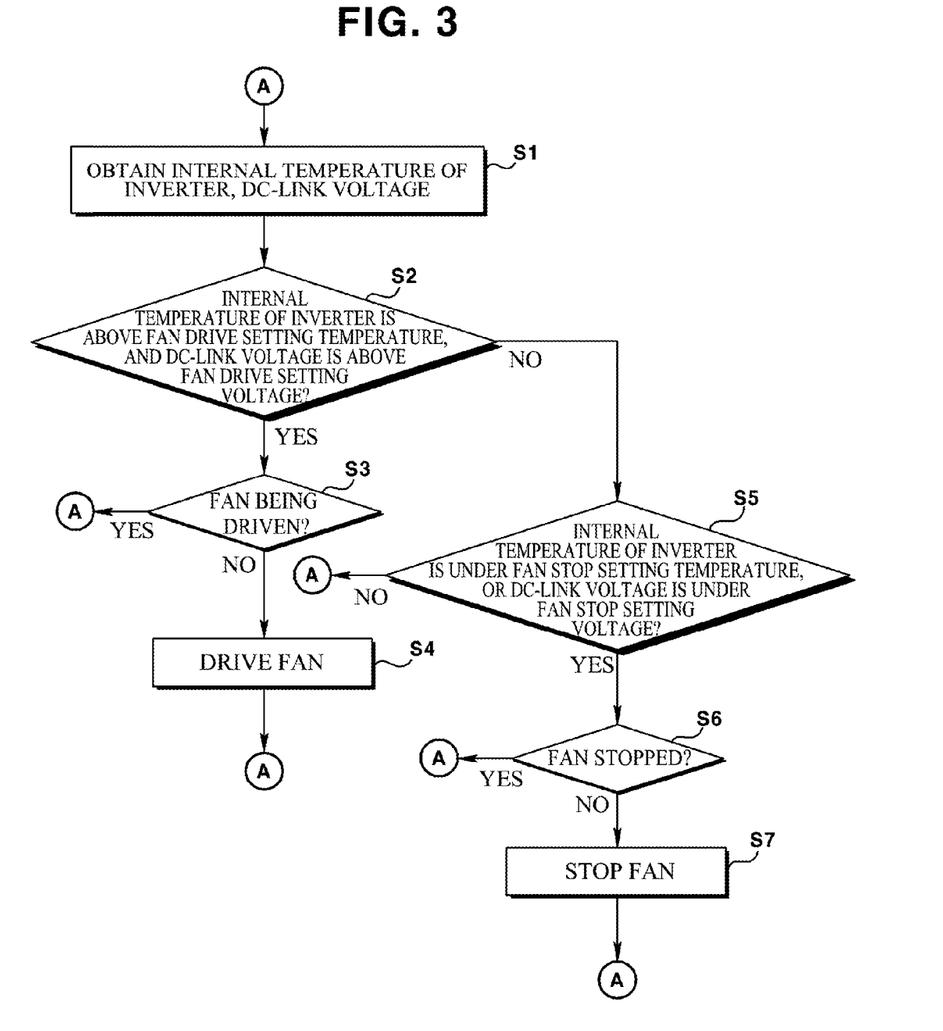
FIG. 3 is a flow chart illustrating a method for controlling temperature of an inverter system by controlling a fan according to an exemplary embodiment of the present disclosure.

FIG. 3 is a flow chart illustrating a method for controlling temperature of an inverter system by controlling a fan according to an exemplary embodiment of the present disclosure.

Referring to FIG. 3, the controller (160) may obtain an internal temperature and a DC-link voltage of the inverter (110) (S1).

The controller (160) may determine whether the internal temperature is above a fan drive setting temperature and the DC-link voltage is above a fan drive setting voltage (S2).

The controller (160) may determine whether the fan (150) is being driven (S3), when a condition where the internal temperature is above a fan drive setting temperature and the DC-link voltage is above a fan drive setting voltage is satisfied, in the result of the determination in step S2.

The controller may output a fan driving control signal for driving the fan (150) to the fan (150) (S4), when the fan (150) is not being driven, in the result of the determination in step S3.

Meanwhile, the controller (160) may determine whether the internal temperature is under a fan stop setting temperature or the DC-link voltage is under a fan stop setting voltage (S5), when the condition where the internal temperature is above a fan drive setting temperature and the DC-link voltage is above a fan drive setting voltage is not satisfied, in the result of the determination in step S2.

The controller (160) may determine whether the fan (150) is stopped (S6), when at least one of the two conditions where the internal temperature is under a fan stop setting temperature or the DC-link voltage is under a fan stop setting voltage is satisfied, in the result of the determination in step S5.

The controller (160) may output a fan stopping control signal for stopping the fan (150) being driven to the fan (150) (S7), when the fan (150) is not stopped, in the result of the determination in step S6.

Figure 4:
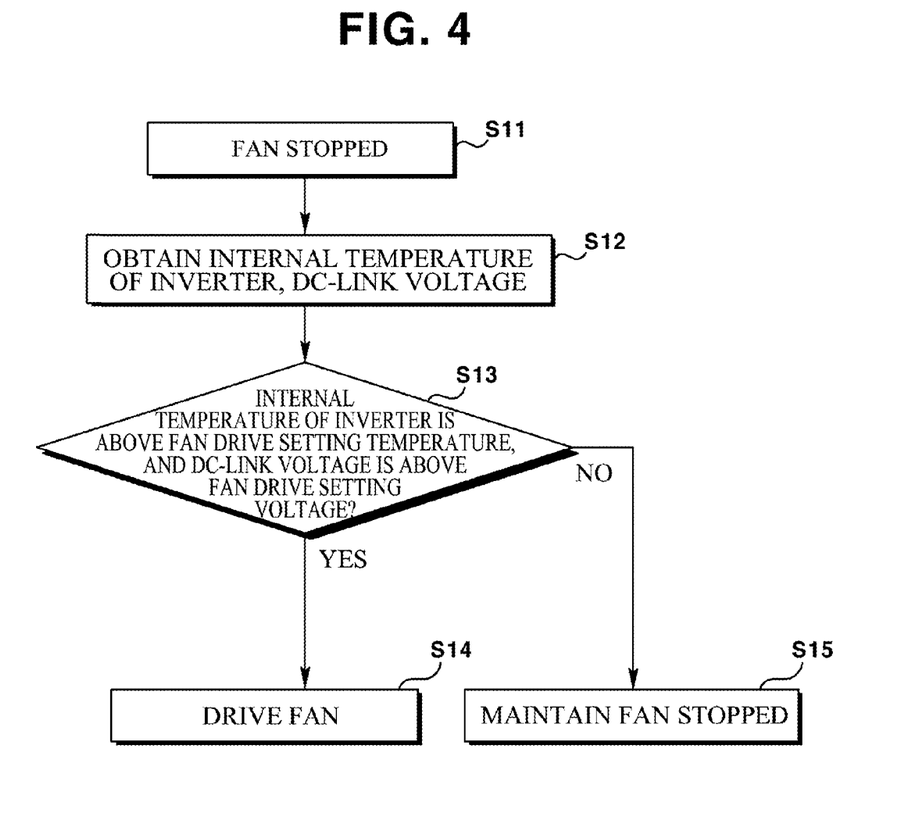
FIG. 4 is a flow chart illustrating a method for controlling temperature of an inverter system by controlling a fan according to an exemplary embodiment of the present disclosure, particularly is an example of applying the temperature control method of an inverter system illustrated in FIG. 3, when the fan is stopped.

FIG. 4 is a flow chart illustrating a method for controlling temperature of an inverter system by controlling a fan according to an exemplary embodiment of the present disclosure, particularly is an example of applying the temperature control method of an inverter system illustrated in FIG. 3, when the fan (150) is stopped.

Referring to FIG. 4, the controller (160) may obtain an internal temperature and a DC-link voltage of the inverter (110) (S12), in a state where the fan (150) is stopped (S11).

The controller (160) may determine whether the internal temperature of the inverter (110) is above the fan drive setting temperature and the DC-link voltage is above the fan drive setting voltage (S13).

The controller (160) may output a fan driving control signal for driving the stopped fan (150) to the fan (150) (S14), when a condition where the internal temperature is above a fan drive setting temperature and the DC-link voltage is above a fan drive setting voltage is satisfied, in the result of the determination in step S13.

Meanwhile, the controller (160) may maintain the fan (150) stopped (S15), when the condition where the internal temperature is above a fan drive setting temperature and the DC-link voltage is above a fan drive setting voltage is satisfied, in the result of the determination in step S13.

Figure 5:
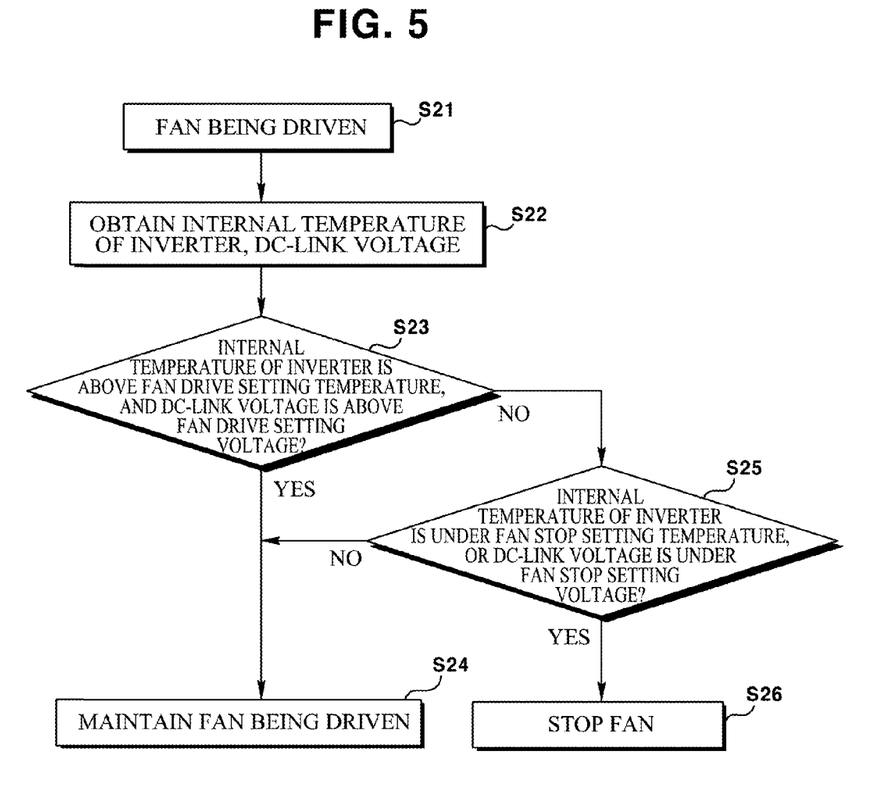
FIG. 5 is a flow chart illustrating a method for controlling temperature of an inverter system by controlling a fan according to an exemplary embodiment of the present disclosure, particularly is an example of applying the temperature control method of an inverter system illustrated in FIG. 3, when the fan is being driven.

FIG. 5 is a flow chart illustrating a method for controlling temperature of an inverter system by controlling a fan according to an exemplary embodiment of the present disclosure, particularly is an example of applying the temperature control method of an inverter system illustrated in FIG. 3, when the fan (150) is being driven.

Referring to FIG. 5, the controller (160) may obtain an internal temperature and a DC-link voltage of the inverter (110) (S22), in a state where the fan (150) is stopped (S21).

The controller (160) may determine whether the internal temperature of the inverter (110) is above the fan drive setting temperature and the DC-link voltage is above the fan drive setting voltage (S23).

The controller (160) may output a fan driving control signal for maintaining the fan (150) being driven to the fan (150) (S24), when a condition where the internal temperature is above a fan drive setting temperature and the DC-link voltage is above a fan drive setting voltage is satisfied, in the result of the determination in step S23.

Meanwhile, the controller (160) may determine whether the internal temperature is under a fan stop setting temperature or the DC-link voltage is under a fan stop setting voltage (S25), when the condition where the internal temperature is above a fan drive setting temperature and the DC-link voltage is above a fan drive setting voltage is not satisfied, in the result of the determination in step S23.

The controller (160) may output a fan stopping control signal for stopping the fan (150) being driven to the fan (150) (S26), when at least one of the two conditions where the internal temperature is under a fan stop setting temperature or the DC-link voltage is under a fan stop setting voltage is satisfied, in the result of the determination in step S25.

The controller (160) may output a fan driving control signal for maintaining the fan (150) being driven to the fan (150) (S24), when none of the two conditions is satisfied, in the result of the determination in step S25.

Figure 6:
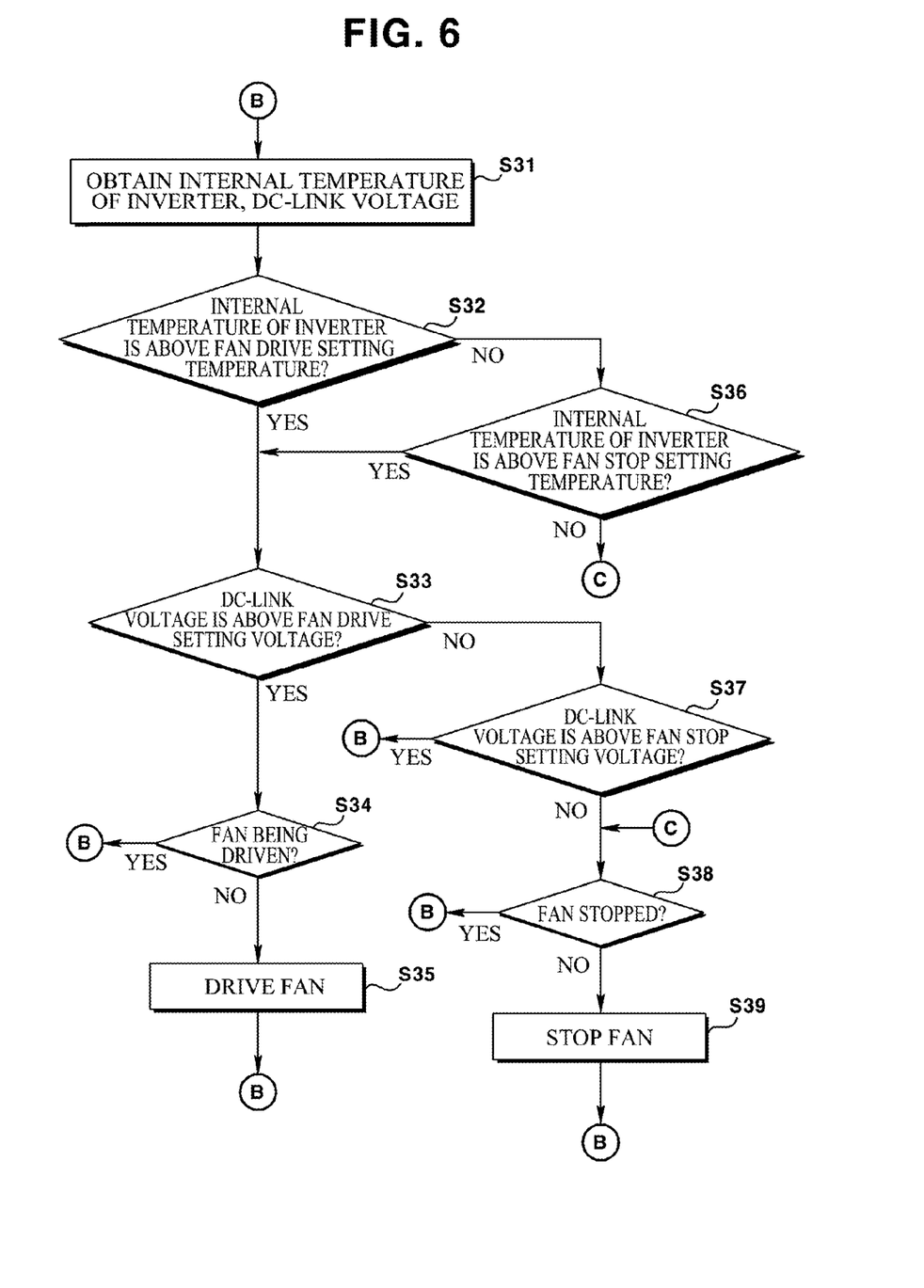
FIG. 6 is a flow chart illustrating a method for controlling temperature of an inverter system by controlling a fan according to another exemplary embodiment of the present disclosure.

FIG. 6 is a flow chart illustrating a method for controlling temperature of an inverter system by controlling a fan according to another exemplary embodiment of the present disclosure.

Referring to FIG. 6, the controller (160) may obtain an internal temperature and a DC-link voltage of the inverter (110) (S31).

The controller (160) may determine whether the internal temperature of the inverter (110) is above the fan drive setting temperature (S32).

The controller (160) may determine whether and the DC-link voltage is above the fan drive setting voltage (S33), when the internal temperature is determined to be above the fan drive setting temperature, in the result of the determination in step S32.

The controller (160) may determine whether the fan (150) is being driven (S34), when the DC-link voltage is determined to be above the fan drive setting voltage, in the result of the determination in step S33.

The controller may output a fan driving control signal for driving the fan (150) to the fan (150) (S35), when the fan (150) is not being driven, in the result of the determination in step S34.

Meanwhile, the controller (160) may determine whether the internal temperature of the inverter (110) is above the fan stop setting temperature (S36), when the internal temperature of the inverter (110) is not determined to be above the fan drive setting temperature, in the result of determination in step S32.

The controller (160) may determine whether the fan (150) is stopped (S38), when the internal temperature of the inverter (110) is not determined to be above the fan stop setting temperature, in the result of the determination in step S36.

The controller (160) may output a fan stopping control signal for stopping the fan (150) in driving to the fan (150) (S39), when the fan (150) is not determined to be stopped, in the result of the determination in step S38.

The controller (160) may determine whether the DC-link voltage is above the fan stop setting voltage (S37), when the DC-link voltage is not determined to be above the fan drive setting voltage, in the result of the determination in step S33.

The controller (160) may determine whether the fan (150) is stopped (S38), when the condition where the DC-link voltage is above the fan stop setting voltage is not satisfied, in the result of the determination in step S37.

The controller (160) may output a fan stopping control signal for stopping the fan (150) being driven to the fan (150) (S39), when the fan (150) is not determined to be stopped, in the result of the determination in step S38.

Figure 7:
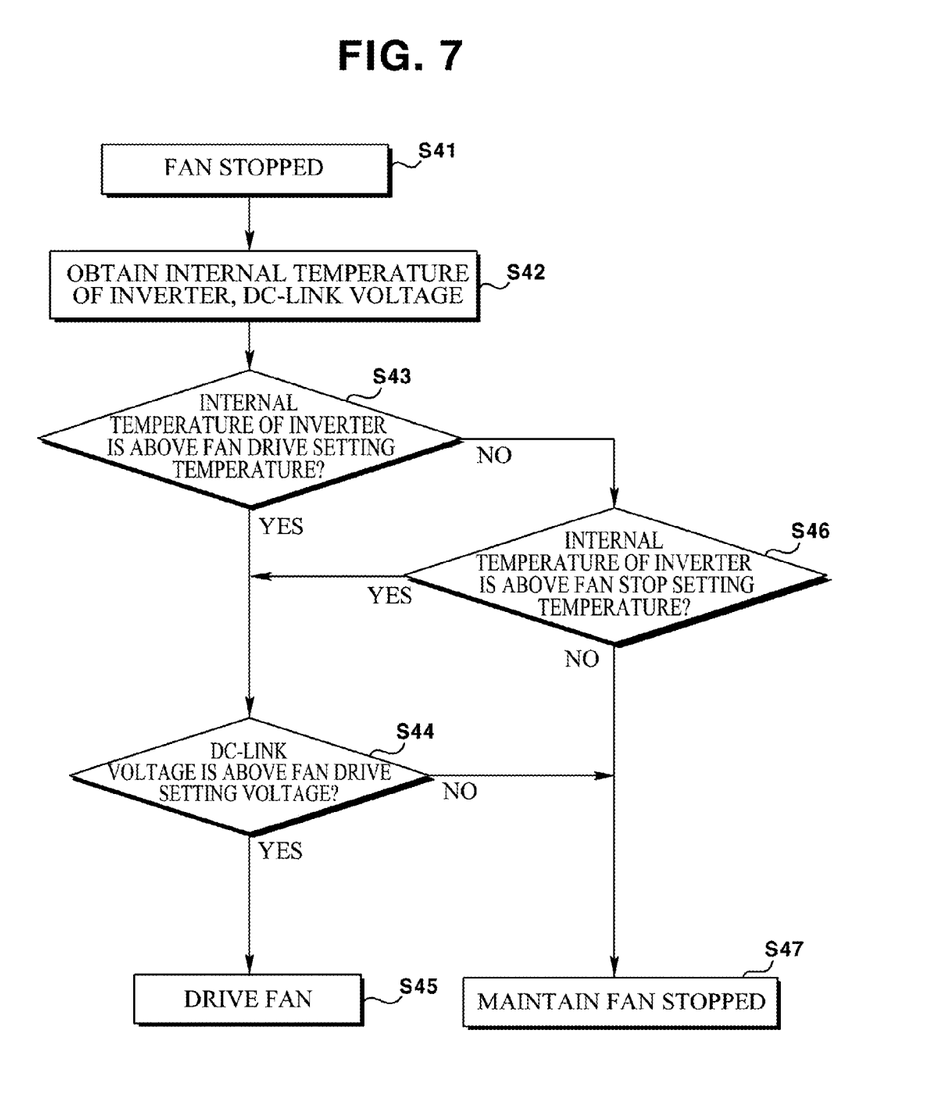
FIG. 7 is a flow chart illustrating a method for controlling temperature of an inverter system by controlling a fan according to another exemplary embodiment of the present disclosure, particularly is an example of applying the temperature control method of an inverter system illustrated in FIG. 6, when the fan is stopped.

FIG. 7 is a flow chart illustrating a method for controlling temperature of an inverter system by controlling a fan according to another exemplary embodiment of the present disclosure, particularly is an example of applying the temperature control method of an inverter system illustrated in FIG. 6, when the fan (150) is stopped.

Referring to FIG. 7, the controller (160) may obtain an internal temperature and a DC-link voltage of the inverter (110) (S42), in a state where the fan (150) is stopped (S41).

The controller (160) may determine whether the internal temperature of the inverter (110) is above the fan drive setting temperature (S43).

The controller (160) may determine whether the DC-link voltage is above the fan drive setting voltage (S44), when the internal temperature of the inverter (110) is determined to be above the fan drive setting voltage, in the result of the determination in step S43.

The controller (160) may output a fan drive control signal for driving the stopped fan (150) to the fan (150) (S45), when the DC-link voltage is determined to be above the fan drive setting voltage, in the result of the determination in step S44.

The controller (160) may output a fan stopping control signal for maintaining the fan (150) stopped to the fan (150) (S47), when the DC-link voltage is not determined to be above the fan drive setting voltage, in the result of the determination in step S44.

Meanwhile, the controller (160) may determine whether the internal temperature of the inverter (110) is above the fan stop setting temperature (S46), when the internal temperature of the inverter (110) is not determined to be above the fan drive setting temperature, in the result of the determination in step S43.

The controller (160) may output a fan stopping control signal for maintaining the fan (150) stopped to the fan (150) (S47), when the internal temperature of the inverter (110) is not determined to be above the fan stop setting temperature, in the result of the determination in step S46.

Meanwhile, the process may proceed to step S44, when the internal temperature of the inverter (110) is determined to be above the fan stop setting temperature, in the result of the determination in step S46.

Figure 8:
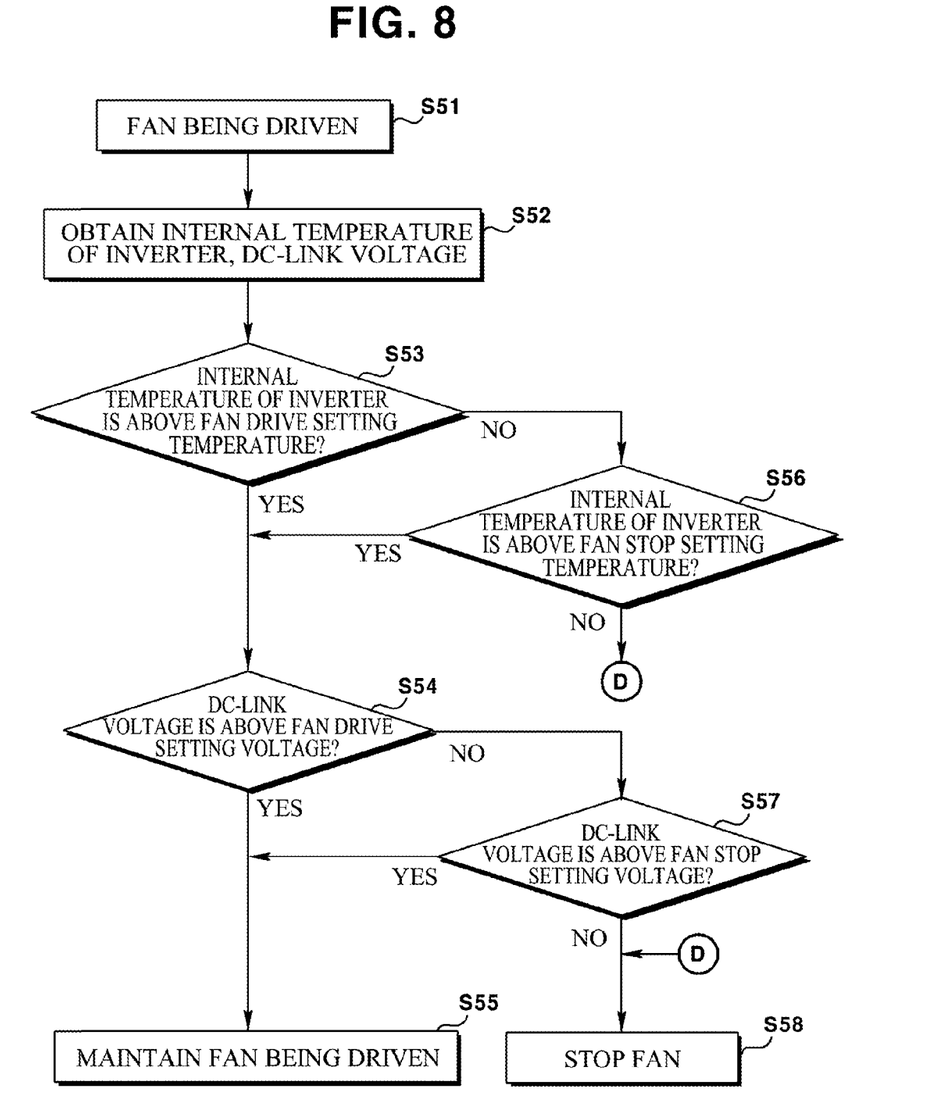
FIG. 8 is a flow chart illustrating a method for controlling temperature of an inverter system by controlling a fan according to another exemplary embodiment of the present disclosure, particularly is an example of applying the temperature control method of an inverter system illustrated in FIG. 6, when the fan is being driven.

FIG. 8 is a flow chart illustrating a method for controlling temperature of an inverter system by controlling a fan according to another exemplary embodiment of the present disclosure, particularly is an example of applying the temperature control method of an inverter system illustrated in FIG. 6, when the fan is being driven.

Referring to FIG. 8, the controller (160) may obtain an internal temperature and a DC-link voltage of the inverter (110) (S52), in a state where the fan (150) is being driven (S51).

The controller (160) may determine whether the internal temperature of the inverter (110) is above the fan drive setting temperature (S53).

The controller (160) may determine whether the DC-link voltage is above the fan drive setting voltage (S54), when the internal temperature of the inverter (110) is determined to be above the fan drive setting temperature, in the result of the determination in step S53.

The controller (160) may output a fan driving control signal for maintaining the driven fan (150) still being driven to the fan (150) (S55), when the DC-link voltage is determined to be above the fan drive setting temperature, in the result of the determination in step S54.

Meanwhile, the controller (160) may determine whether the internal temperature of the inverter (110) is above the fan stop setting temperature (S56), when the internal temperature of the inverter (110) is not determined to be above the fan drive setting temperature, in the result of the determination in step S53.

The process may proceed to step S54, when the internal temperature of the inverter (110) is determined to be above the fan stop setting temperature, in the result of the determination in step S56.

The controller (160) may output a fan stopping control signal for stopping the fan (150) in driving to the fan (150) (S58).

Meanwhile, the controller (160) may determine whether the DC-link voltage is above the fan stop setting voltage (S57), when the DC-link voltage is not determined to be above the fan drive setting signal, in the result of the determination in step S54.

The controller (160) may output a fan stopping control signal for stopping the fan (150) in driving to the fan (150) (S58), when a condition where the DC-link voltage is above the fan stop setting voltage is not satisfied, in the result of the determination in step S57.

The controller (160) may output a fan stopping control signal for maintaining the fan (150) still being driven to the fan (150) (S55), when a condition where the DC-link voltage is above the fan stop setting voltage is not satisfied, in the result of the determination in step S57.

The abovementioned exemplary embodiments are intended to be illustrative, and not to limit the scope of the claims. Many alternatives, modifications, variations, and equivalents will be apparent to those skilled in the art. The features, structures, methods, and other characteristics of the exemplary embodiments described herein may be combined in various ways to obtain additional and/or alternative exemplary embodiments. Therefore, the technical scope of the rights for the present disclosure shall be decided by the claims and equivalents thereof.

For example, according to an exemplary embodiment of the present disclosure, the step of outputting the fan driving control signal to the fan may be realized by including: determining whether the internal temperature is above a predetermined fan driving setting temperature; determining whether the DC-link voltage is above a predetermined fan driving setting voltage, when the internal temperature is determined to be above the predetermined fan driving setting temperature; and outputting a fan driving control signal for driving the fan or maintaining the fan being driven to the fan, when the DC-link voltage is determined to be above a predetermined fan drive setting voltage.

According to another modified exemplary embodiment of the present disclosure, the step of outputting the fan driving control signal to the fan may be realized by including: determining whether the DC-link voltage is above a predetermined fan driving setting voltage; determining whether the internal temperature is above a predetermined fan driving setting temperature, when the DC-link voltage is determined to be above the predetermined fan driving setting voltage; and outputting a fan driving control signal for driving the fan or maintaining the fan being driven to the fan, when the internal temperature is determined to be above a predetermined fan drive setting temperature.

What is claimed is:

1. A method for controlling temperature of an inverter system having an inverter and a cooling fan, the method comprising:
   obtaining an internal temperature of the inverter and a DC (Direct Current)-link voltage of the inverter; and
   outputting a fan driving control signal for driving the fan or maintaining the fan being driven to the fan, when the internal temperature is above a predetermined fan drive setting temperature and the DC-link voltage is above a predetermined fan drive setting voltage.

2. The method of claim 1, wherein the outputting the fan driving control signal to the fan includes:
   outputting a fan driving control signal for driving the fan to the fan, when the internal temperature is above a predetermined fan drive setting temperature and the DC-link voltage is above a predetermined fan drive setting voltage, in a state where the fan is stopped.

3. The method of claim 1, wherein the outputting the fan driving control signal to the fan includes:
   outputting a fan driving control signal for maintaining the fan being driven to the fan, when the internal temperature is above a predetermined fan drive setting temperature and the DC-link voltage is above a predetermined fan drive setting voltage, in a state where the fan is being driven.

4. The method of claim 1, wherein the outputting the fan driving control signal to the fan includes:
   determining whether the internal temperature is above the predetermined fan driving setting temperature;
   determining whether the DC-link voltage is above the predetermined fan driving setting voltage, when the internal temperature is determined to be above the predetermined fan driving setting temperature; and
   outputting the fan driving control signal for driving the fan or maintaining the fan being driven to the fan, when the DC-link voltage is determined to be above a predetermined fan drive setting voltage.

5. The method of claim 4, wherein the outputting the fan driving control signal to the fan includes:
   outputting the fan driving control signal for driving the fan to the fan when the fan is stopped, when the DC-link voltage is determined to be above the predetermined fan drive setting voltage.

6. The method of claim 4, wherein the outputting the fan driving control signal to the fan includes:
   outputting the fan driving control signal for maintaining the fan being driven to the fan when the fan is being driven, when the DC-link voltage is determined to be above the predetermined fan drive setting voltage.

7. The method of claim 1, wherein the outputting the fan driving control signal to the fan includes:
   determining whether the DC-link voltage is above the predetermined fan driving setting voltage;
   determining whether the internal temperature is above the predetermined fan driving setting temperature, when the DC-link voltage is determined to be above the predetermined fan driving setting voltage; and
   outputting the fan driving control signal for driving the fan or maintaining the fan being driven to the fan, when the internal temperature is determined to be above the predetermined fan drive setting temperature.

8. The method of claim 7, wherein the outputting the fan driving control signal to the fan includes:
   outputting the fan driving control signal for driving the fan to the fan, when the internal temperature is determined to be above the predetermined fan drive setting temperature, in the state where the fan is stopped.

9. The method of claim 7, wherein the outputting the fan driving control signal to the fan includes:
   outputting a fan driving control signal for maintain the fan being driven to the fan, when the internal temperature is determined to be above the predetermined fan drive setting temperature, in the state where the fan is being driven.

10. The method of claim 1, further comprising:
    outputting a fan stopping control signal for stopping the fan to the fan in response to the fan driving control signal, when the internal temperature is determined to be under a predetermined fan stop setting temperature or the DC-link voltage is determined to be under a predetermined fan stop setting voltage, in the state where the fan is being driven.

11. The method of claim 10, wherein
    the fan stop setting temperature is predetermined to be under the fan drive setting temperature, and
    the fan stop setting voltage is predetermined to be under the fan drive setting voltage.

* * * * *